US012774883B2

(12) United States Patent
Voleti et al.

(10) Patent No.: US 12,774,883 B2
(45) Date of Patent: Oct. 27, 2026

(54) SAMPLE THICKNESS METROLOGY USING FOCUSED BEAM INTERFERENCE

(71) Applicant: Applied Materials, Inc., Santa Clara, CA (US)

(72) Inventors: Venkatakaushik Voleti, Santa Clara, CA (US); Mehdi Vaez-Iravani, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 18/586,090

(22) Filed: Feb. 23, 2024

(65) Prior Publication Data

US 2025/0012560 A1 Jan. 9, 2025

Related U.S. Application Data

(60) Provisional application No. 63/512,441, filed on Jul. 7, 2023.

(51) Int. Cl.
*G01B 11/06* (2006.01)
*H10P 72/00* (2026.01)

(52) U.S. Cl.
CPC ...... *G01B 11/0675* (2013.01); *H10P 72/0604* (2026.01)

(58) Field of Classification Search
CPC ............ G01B 11/0675; G01B 9/02028; G01B 11/06; G01B 11/0625; H01L 21/67253
See application file for complete search history.

(56) References Cited

U.S. PATENT DOCUMENTS

| | | | | |
|---|---|---|---|---|
| 5,909,282 A * | 6/1999 | Kulawiec | G01B 11/06 356/504 |
| 6,406,924 B1 * | 6/2002 | Grimbergen | H01L 22/26 438/743 |
| 7,002,665 B2 * | 2/2006 | Sato | G03B 27/72 430/30 |
| 12,276,490 B2 * | 4/2025 | Vaez-Iravani | C23C 14/547 |

(Continued)

FOREIGN PATENT DOCUMENTS

| | | | |
|---|---|---|---|
| JP | H0882511 A | 3/1996 |
| JP | 2000310512 A | 11/2000 |

OTHER PUBLICATIONS

International Search Report and Written Opinion for International Application No. PCT/US2024/036561, mailed Oct. 15, 2024, 10 pages.

*Primary Examiner* — Jonathan M Hansen
(74) *Attorney, Agent, or Firm* — Lowenstein Sandler LLP

(57) ABSTRACT

Disclosed systems and techniques are directed to interferometry-based sample thickness metrology in manufacturing systems. For example, the disclosed techniques include directing a focused beam to a plurality of locations of a sample and detecting an interference pattern (IP) associated with a light departing from the respective location and generated upon interaction of the focused beam with the sample. The techniques further include determining, based on a first IP associated with a first light departing from a first location and a second IP associated with a second light departing from a second location, a magnitude and a sign of a difference between a first thickness of the sample at the first location and a second thickness of the sample at the second location.

20 Claims, 8 Drawing Sheets

(56) References Cited

U.S. PATENT DOCUMENTS

2002/0057437 A1* 5/2002 McMillen .......... G01B 11/0625 356/504
2012/0002213 A1* 1/2012 Kannaka ............ G01B 11/2441 356/492
2012/0084045 A1* 4/2012 Koshimizu ........ G01B 11/0675 702/134
2014/0268118 A1* 9/2014 Xu ..................... G01N 21/9501 356/237.5
2015/0159995 A1* 6/2015 Tixier ................ G01B 11/0633 702/172
2023/0011748 A1* 1/2023 Vaez-Iravani ......... C23C 14/547
2024/0280913 A1* 8/2024 Tsai .................... G03F 7/70558
2025/0224228 A1* 7/2025 Vaez-Iravani ......... C23C 14/547

* cited by examiner

SAMPLE THICKNESS METROLOGY USING FOCUSED BEAM INTERFERENCE

RELATED APPLICATIONS

This application claims the benefit of priority from U.S. Provisional Application No. 63/512,441, "DETECTION OF SAMPLE THICKNESS AND SAMPLE THICKNESS VARIATIONS WITH FOCUSED BEAM INTERFERENCE," filed on Jul. 7, 2023, which is incorporated herein by reference in its entirety.

TECHNICAL FIELD

This instant specification generally relates to ensuring quality control of materials manufactured in substrate processing systems. More specifically, the instant specification relates to optical inspection of sample uniformity during various stages of manufacturing.

BACKGROUND

Manufacturing of modern materials often involves various deposition techniques, such as chemical vapor deposition (CVD) or physical vapor deposition (PVD) techniques, in which atoms of one or more selected types are deposited on a substrate (wafer) held in low or high vacuum environments that are provided by vacuum deposition chambers. Materials manufactured in this manner may include monocrystals, semiconductor films, fine coatings, and numerous other substances used in practical applications, such as electronic device manufacturing. Many of these applications rely on the purity of the materials grown in substrate processing systems. The need to maintain isolation of the inter-chamber environment and to minimize its exposure to ambient atmosphere and contaminants therein gives rise to various robotic techniques of sample manipulation and inspection. Improving precision, reliability, and efficiency of such robotic techniques presents a number of technological challenges whose successful resolution facilitates continuing progress of electronic device manufacturing. This is especially applicable given that the demands to the quality of chamber manufacturing products are constantly increasing.

SUMMARY

In one implementation, disclosed is a method that includes directing a first focused beam to a first location of a sample, detecting a first interference pattern (IP) associated with a first light departing from the first location and generated upon interaction of the first focused beam with the sample, directing a first focused beam to a second location of the sample, and detecting a second IP associated with a second light departing from the second location and generated upon interaction of the first focused beam with the sample. The method further include determining, based on the first IP and the second IP, a magnitude of a difference between a first thickness of the sample at the first location and a second thickness of the sample at the second location, and a sign of the difference between the first thickness of the sample at the first location and the second thickness of the sample at the second location.

In another implementation, disclosed is a system that includes an illumination system to generate a first focused beam, direct the first focused beam to a first location of a sample; and direct the first focused beam to a second location of the sample. The system further includes a detection system to detect a first interference pattern (IP) associated with a first light departing from the first location and generated upon interaction of the first focused beam with the sample, and detect a second IP associated with a second light departing from the second location and generated upon interaction of the first focused beam with the sample. The system further includes a processing device to determine, based on the first IP and the second IP, a magnitude of a difference between a first thickness of the sample at the first location and a second thickness of the sample at the second location, and a sign of the difference between the first thickness of the sample at the first location and the second thickness of the sample at the second location.

In another implementation, disclosed is a semiconductor manufacturing system that includes a semiconductor manufacturing system that includes one or more processing chambers to process a sample and a sample thickness metrology system. The sample thickness metrology system includes an illumination system to generate a first focused beam, direct the first focused beam to a first location of a sample, and direct the first focused beam to a second location of the sample. The sample thickness metrology system further includes a detection system to detect a first interference pattern (IP) associated with a first light departing from the first location and generated upon interaction of the first focused beam with the sample, and detect a second IP associated with a second light departing from the second location and generated upon interaction of the first focused beam with the sample. The sample thickness metrology system further includes a processing device to determine, based on the first IP and the second IP, a magnitude of a difference between a first thickness of the sample at the first location and a second thickness of the sample at the second location, and a sign of the difference between the first thickness of the sample at the first location and the second thickness of the sample at the second location.

DETAILED DESCRIPTION

Processing operations performed in sample manufacturing systems include material deposition, etching, patterning, chemical or mechanical polishing, and/or various other operations. Most such operations affect thickness of samples as one or more materials can be added (e.g., by deposition) to a sample or removed (e.g., by etching or polishing) from a sample. Thickness can be changed globally (e.g., via uniform sample polishing, film deposition, etc.) or locally (e.g., via patterning, local deposition and/or etching, etc.). Maintaining proper thickness uniformity or ensuring that patterning comports to a specification of a given processing operation is important for efficient and high-quality sample manufacturing. Uncontrolled thickness variations, even as small as several microns, can negatively affect material properties, surface quality, cleanliness (presence of defects and impurities), chemical composition, and/or other physical or chemical characteristics of samples. Similarly, accurate knowledge of the uniformity of the manufacturing yield can be important for an accurate set up of different stages of processing.

Accordingly, ensuring that a thickness profile h(X,Y) of a sample (e.g., wafer with or without patterning and/or one or more films deposited thereon) surface may be represented by a dependence of a height (width, depth) is important as part of process metrology and sample quality control. For example, having an accurate information about thickness variations of samples enables process engineers and/or various algorithms of robotic processing to correct processing errors and sample's imperfections while the sample is still inside the processing system and before a manufacturing process is complete, which can significantly improve sample quality, reduce roughness, and/or the like.

Aspects and embodiments of the present disclosure address these and other challenges of the existing techniques of sample quality control by providing for systems and techniques that implement interference-based thickness measurements. In some embodiments, a semi-transparent or transparent sample (depending on a wavelength of light) can be measured by detecting and tracking changes in an interference pattern that is formed on an array of optical detectors by beams reflected from a top surface and a bottom surface of a sample.

Figure 1:
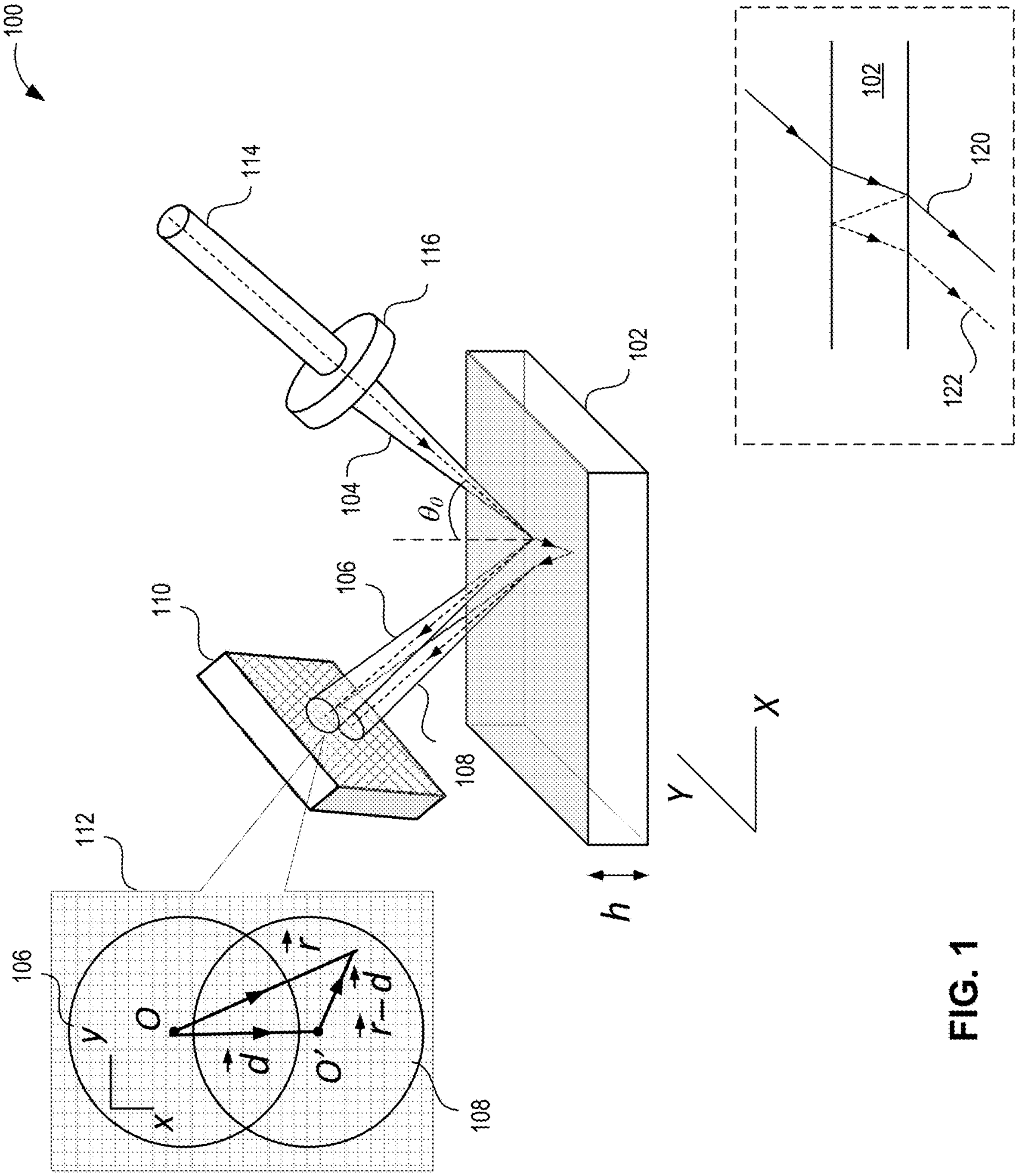
FIG. 1 illustrates an example interferometry technique for determination of thickness variations of samples processed in manufacturing systems, in accordance with at least one embodiment.

FIG. 1 illustrates an example interferometry technique 100 for determination of thickness variations of samples processed in manufacturing systems, in accordance with at least one embodiment. A thickness metrology system directs a focused beam 104 to a sample 102 that reflects at least two beams 106 and 108, e.g., from a top surface of sample 102 and a bottom surface of sample 102, respectively. In particular, reflected beam 108 reflected from the bottom surface of sample 102 of thickness h travels an extra vertical distance 2h, compared with beam 108 reflected from the top surface. This causes reflected beam 108 to incur an additional phase relative to reflected beam 106:

$$\Phi_1 = \frac{4\pi hn}{\lambda}\cos\theta + \pi, \quad \text{Eq. (1)}$$

where θ is a refraction angle of beam propagation inside the sample (relative to the normal direction), n is the refractive index of a material of sample 102 at the wavelength of light of beams 104, 106, and 108 (with the extra phase shift n caused by reflection of reflected beam 106 from the top surface of sample 102). Correspondingly, sample 102 operates as a Fabry-Perot interferometer with reflected beams 106 and 108 interfering constructively (high reflectance/low transmittance) when phase $\Phi_1$ is an integer number of 2π and interfering destructively when phase $\Phi_1$ is a half-integer number of 2π (low reflectance/high transmittance).

Thickness h of (non-uniform) sample 102 can depend on in-plane coordinates X, Y (e.g., Cartesian coordinates, polar coordinates, and/or any other suitable coordinates), h=h(X, Y). If the incident beam is collimated, the light reflected from non-uniform sample 102 displays a sequence of bright and dark interference fringes as the incident beam scans across the surface of sample 102. In particular, according to Eq. (1), two consecutive bright or dark fringes are observed in the reflections from points where thickness h changes by $\Delta h=\lambda/(2n)$. This periodic change of the interference patterns formed by a collimated beam, however, does not disambiguate increases in thickness h from decreases in thickness h and, while representative of local variations of the thickness, provides no direct information on the sign of the variations. Furthermore, very smooth variations of thickness do not result in a formation of interference patterns and instead lead to single-valued interferograms whose overall intensity is modulated as the incident beam scans across the surface of sample 102.

As disclosed herein, using a focused beam 104, depicted in FIG. 1, leads to the width of reflected beams 106 and 108 expanding with a distance z from sample 102. This results in formation of interference patterns that behave differently for different signs of the thickness change Δh(X,Y).

The variations of the total reflected light intensity caused by a combination of reflected beams 106 and 108 can be detected by a detection system that includes a detector array 110, e.g., a digital camera or some other multi-pixel imaging device. Utilizing narrow beams, e.g., as illustrated schematically in FIG. 1, enables spatial resolution of interference fringes on the imaging plane 112 of detector array 110. For example, focused incident beam 104 can be generated by focusing an incident beam 114 (e.g., a collimated beam) by one or more elements of focusing optics 116. In one illustrative non-limiting embodiment, incident beam 104 can be a Gaussian beam having at its narrowest point (e.g., on the top surface of sample 102) the profile ~exp $$\left(-r^2/w_0^2\right)$$

with a certain half-width $w_0$, where r is the radial distance from the axis of incident beam 104. Similarly, reflected beams 106 and 108 are also Gaussian beams, with the half-width w(z) that increases with the distance z from sample 102, e.g., $$w^2(z) = w_0^2 + \lambda^2 z^2/(\pi w_0)^2.$$

In particular, the electric field in reflected beam 106 is $$E_1 = E\frac{w_0}{w(z)}\exp\left[-r^2/w^2(z)\right]\exp\left[-\left(ikz + \frac{ikr^2}{2R(z)}\right)\right], \quad \text{Eq. (2)}$$

where $k=2\pi/\lambda$ is the central wavevector of the beam and $R(z)$ is the local radius of curvature of its wavefront, e.g., $$R(z)=z\left(1+\frac{\pi^2 w_0^4}{\lambda^2 z^2}\right), \quad \text{Eq. (3)}$$

and E is the amplitude of reflected beam 106 (on its axis at the narrowest point z=0). The extra phase $k\vec{r}^2/R(z)$ is associated with the curved wavefront of the beam.

Similarly, the electric field of the bottom-reflected beam 108 is $$E_2=E'\frac{w_0}{w(z)}\exp\left[-(\vec{r}-\vec{d})^2/w^2(z)\right]\exp\left[-\left(ikz+\frac{ik(\vec{r}-\vec{d})^2}{2R(z)}\right)+\Phi_1\right], \quad \text{Eq. (4)}$$

where the wavefront is parallel-shifted by $\vec{d}=(d, 0,0)$ to a distance d that is caused by the beam propagation inside sample 102. (Reflected beam 108 also incurs phase @1 given by Eq. (1), as described above.) Distance d is determined by the angle of incidence $\theta_0$ of incident beam 104, e.g., $d=2h \tan\theta \cos\theta_0$, where $\theta$ and $\theta_0$ are related by Snell's law, $\sin\theta_0=n \sin\theta$. If imaging plane 112 of detector array 110 is perpendicular to the axes of reflected beams 106 and 108, the distance d also represents the distance between a center O of reflected beam 106 and a center O' of reflected beam 108, as illustrated by the top-left inset in FIG. 1 The geometric meaning of vectors $\vec{r}$ and $\vec{r}-\vec{d}$ is also illustrated by the inset.

The intensity of reflected light, $I=|E_1+E_2|^2=I_1+I_2+I_{INT}$, measured by detector array 110, includes the sum of two intensities $I_1=|E_1|^2$ and $I_2=|E_2|^2$ and an interference pattern occurring between reflected beam 106 and reflected beam 108, e.g., $$I_{INT}(\vec{r})=E_1^*E_2+E_1E_2^*=2A(\vec{r})\cos[\Phi_1+\Phi_2(\vec{r})], \quad \text{Eq. (5)}$$

where $\Phi_2(\vec{r})$ is a non-uniform (position-dependent) contribution to the total phase $$\Phi_2(\vec{r})=-\frac{k(\vec{r}-\vec{d})^2}{R(z)}+\frac{k\vec{r}^2}{R(z)}\equiv\frac{-k(x-d)^2}{R(z)}+\frac{kx^2}{R(z)}\equiv\frac{-k(d-2x)d}{R(z)}, \quad \text{Eq. (6)}$$

arising from the wavefront curvature. The position-dependent amplitude of the interference pattern is $$A(\vec{r})=\frac{w_0^2}{w^2(z)}\exp\left(-\frac{(\vec{r}-\vec{d})^2+\vec{r}^2}{w^2(z)}\right), \quad \text{Eq. (7)}$$

and varies with the radius-vector $\vec{r}$ within the imaging plane 112.

For a sample 102 with a uniform (position-independent) profile h(X,Y), interference pattern $I_{INT}(\vec{r})$, measured by detector array 110, likewise remains constant as focused beam 104 is scanned across the sample. In samples with non-uniform thickness profiles h(X,Y), as thickness h changes with X and/or Y, the uniform phase $\Phi_1$ is modified (e.g., as described above) and shifts the interference pattern $I_{INT}(\vec{r})$ along the x-axis of the detector array 110 (the x-axis, as drawn in FIG. 1, is parallel to the vector d connecting centers of the two reflected beams). Depending on whether the thickness h(X,Y) is increasing or decreasing, the interference pattern $I_{INT}(\vec{r})$ shifts along one or the other direction of the x-axis. The interference pattern repeats itself for every $$\Delta h(X,Y)=\left[\frac{\lambda}{2n\cos\theta}\right].$$

Correspondingly, the direction in which the interference pattern $I_{INT}(\vec{r})$ shifts can unambiguously identify whether the sample thickness is increasing ($\Delta h>0$) along the direction of scanning or decreasing ($\Delta h<0$) and the amount of the shift, relative to the detector array 110, can indicate a magnitude of the change $\Delta h$.

Although, for the sake of specificity, the techniques of interferometry-based thickness metrology monitoring are often described as being performed using interference patterns in the reflected light, the same or similar techniques can be used with using interference patterns in a light transmitted through a sample. For example, as shown in the bottom-right inset in FIG. 1, a first transmitted beam 120 can be a beam that experiences a first refraction when entering sample 102 though its top surface and a second refraction when leaving the sample through its bottom surface. A second transmitted beam 122 can be a beam that additionally experiences a first reflection from the bottom surface of sample 102 and a second reflection from its top surface before leaving sample 102 through the bottom surface.

The same, or similar, techniques can be used in samples that include one or more layers of material, e.g., a wafer and one or more films deposited thereon. In some embodiments, a change of phase $\Phi_1$ associated with the propagation of light though such a layered stack can be computed (or simulated) for specific types and thicknesses of materials of the stack or pre-measured and stored as part of calibration data for each of the stacks for which thickness metrology can be performed. In some instances, the total thickness of the films added to the wafer can be small compared to the total thickness of the wafer. In such instances, a contribution to phase $\Phi_1$ of the films can be ignored or modeled with a thickness-dependent value that is determined using computations, simulations, and/or calibration measurements.

Figure 2:
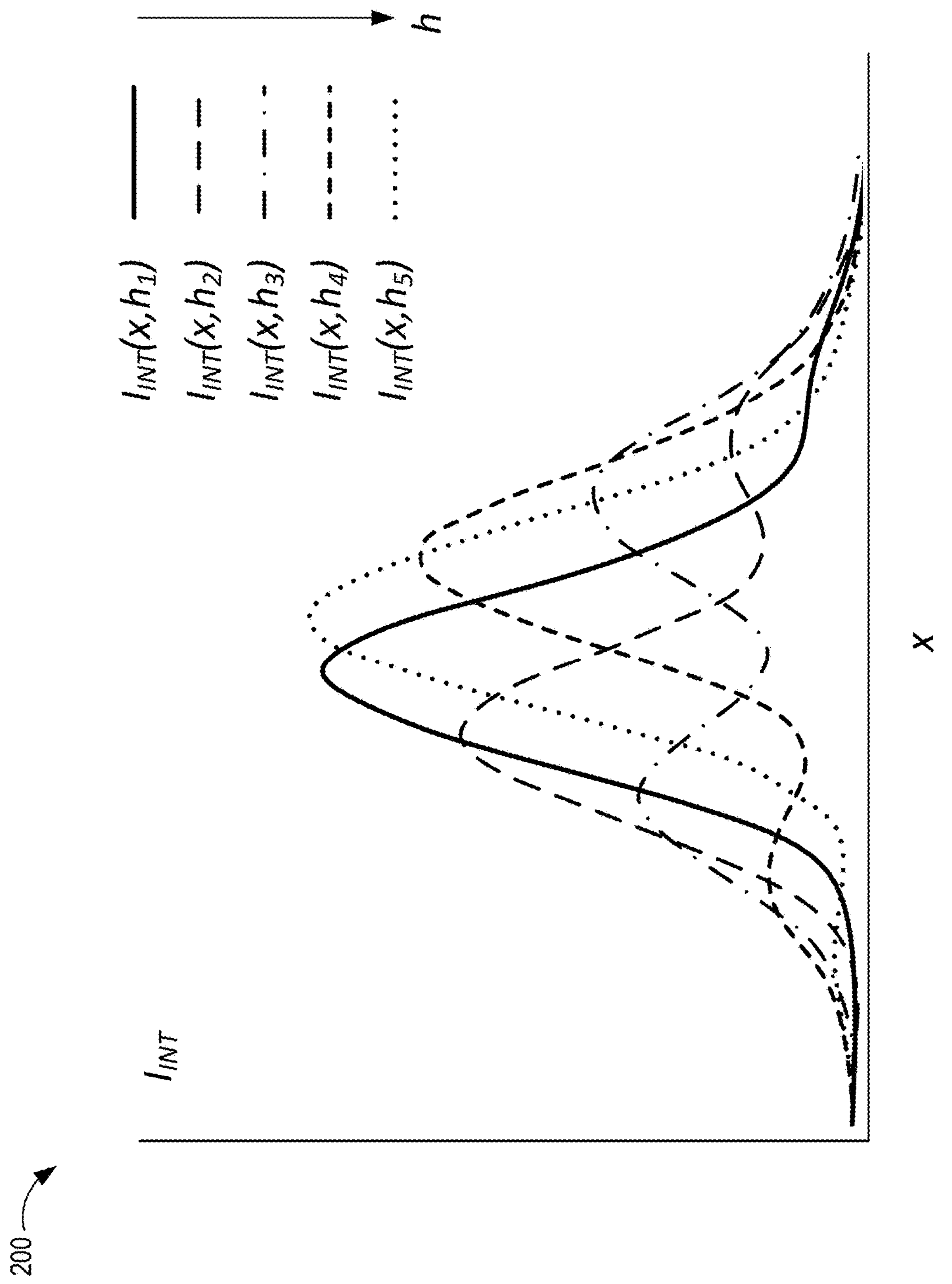
FIG. 2 illustrates schematically changes in an interference picture caused by changes in the thickness of a sample detected with the example interferometry technique of FIG. 1, in accordance with at least one embodiment.

FIG. 2 illustrates schematically changes in an interference picture 200 caused by changes in the thickness of a sample detected with the example interferometry technique of FIG. 1, in accordance with at least one embodiment. Plots in interference picture 200 depict simulated interference patterns $I_{INT}(x, h_1)$, . . . $I_{INT}(x, h_5)$ for five different thicknesses of an example wafer, $h_1$ . . . $h_5$. Interference picture 200 corresponds to a fixed field of view of the detector array 110 for z=150 mm and half-width $w_0$=50 μm. The five individual patterns in FIG. 2 correspond to an appearance of a single pattern moving in the positive direction of the x-axis. Opposite changes of the wafer's thickness result in the motion of the same pattern in the negative direction of the x-axis. The motion of the patterns is accompanied with the changes in the patterns' shapes, as discussed above.

Figure 3A:
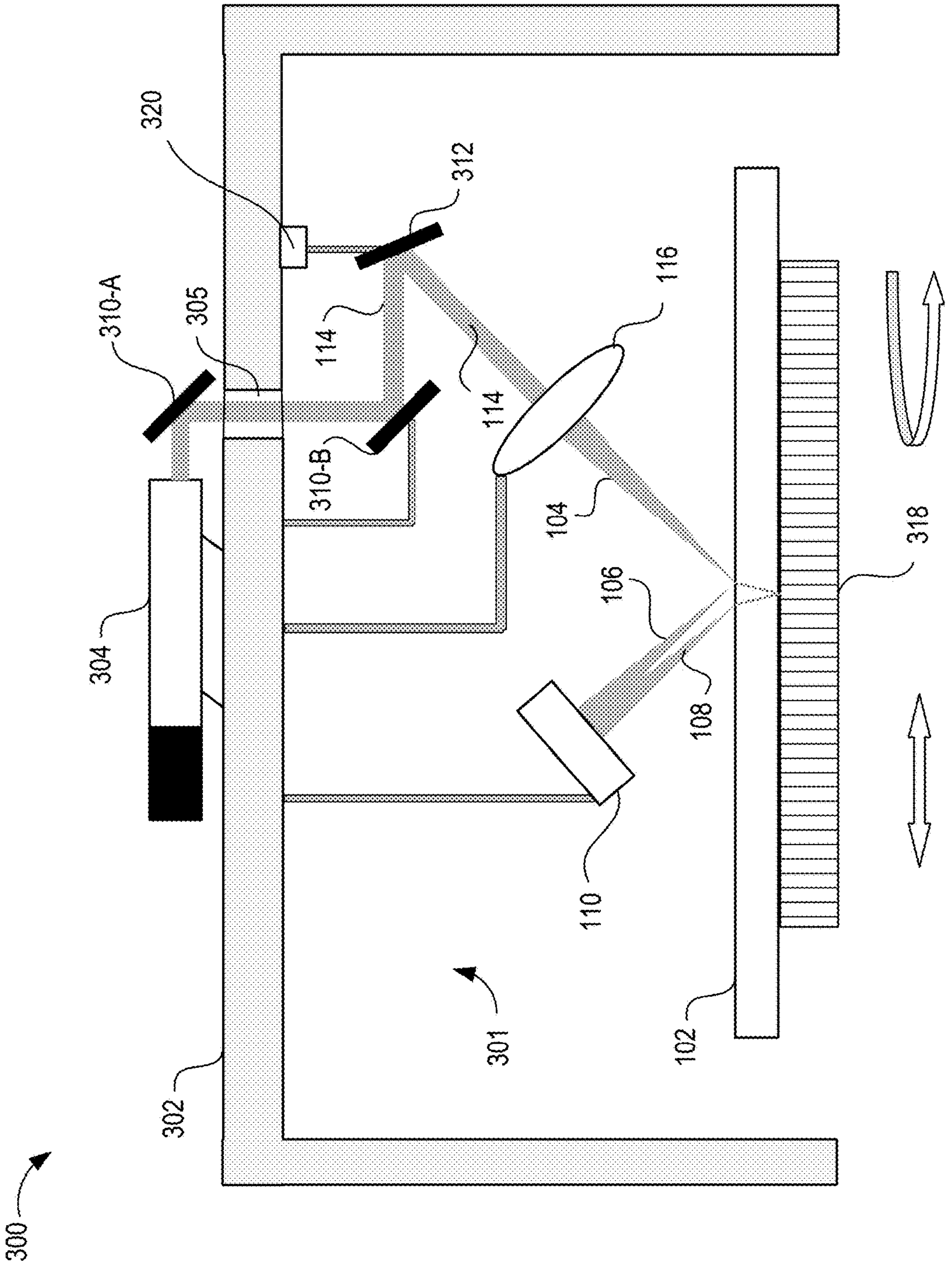
FIG. 3A illustrates one example of an interferometry-based thickness metrology system that can be used with sample manufacturing systems, in accordance with at least one embodiment.

FIG. 3A illustrates one example of an interferometry-based thickness metrology system 300 that can be used with sample manufacturing systems, in accordance with at least one embodiment. Sample 102 can be located inside a processing chamber 301 having by a housing 302 a portion of which is shown in FIG. 3A. Sample 102 can be (or include) a bare wafer, a wafer with one or more films deposited thereon, an unpatterned wafer, an unpolished wafer, a polished wafer, and/or any other type of wafer, substrate, or material. Processing chamber 301 can be used to perform any suitable manufacturing operation pertaining to chemical mechanical polishing (CMP), chemical vapor deposition (CVD), physical vapor deposition (PVD), plasma-enhanced CVD, plasma-enhanced PVD, sputter deposition, atomic layer CVD, combustion CVD, catalytic CVD, evaporation deposition, molecular-beam epitaxy techniques, and/or the like. Processing chamber 301 can use any applicable pressure, including high-vacuum pressure, low-vacuum pressure, atmospheric pressure, above-atmospheric pressure, and/or the like. An environment of processing chamber 301 can be held at any applicable temperature, e.g., above room temperature (including but not limited to plasma environment), room temperature, below room temperature, at or about liquid nitrogen temperature, below liquid nitrogen temperature, and/or the like.

Sample 102 can be illuminated using an illumination system that includes a light source 304 that generates an incident beam 114. In some embodiments, as shown in FIG. 3A, light source 304 can be positioned outside housing 302 of processing chamber 301 and the light emitted by light source 304 can be directed into processing chamber 301 through a transparent window 305. Light source 304 can be a pulsed laser, a continuous wave laser, a light-emitting diode, or any other suitable light source. Light source 304 can emit a narrowband light.

In some embodiments, a system of mirrors 310 can be used to direct incident beam 114 along a desired path within processing chamber 301. In some embodiments, the illumination system can include expander optics, collimating optics, and/or other optical elements. The illumination system can further include one or more polarizers, configured to polarize incident beam 114 to a specific target polarization, e.g. s-polarization or p-polarization. The illumination subsystem can be capable of controlling intensity of incident beam 114, e.g., by controlling the cross section of incident beam 114 and/or by controlling the intensity of light produced by light source 304.

Incident beam 114 can be focused, using focusing optics 116, into focused beam 104 that is directed onto sample 102. Focusing optics 116 can include one or more lenses and/or one or more curved mirrors.

Light reflected from sample 102 can include multiple beams generated upon a corresponding number of reflections of focused beam 104 by two surfaces of sample 102. Reflected beams can be collected using a detection system that includes a detector array 110. Two reflected beams are illustrated in FIG. 3A as being detected by detector array 110—reflected beam 106 that is reflected from the top surface of sample 102 and reflected beam 108 that is reflected from the bottom surface of sample 102—but additional (higher-order) reflected beams can also be collected by detector array 110, in some embodiments.

In some embodiments, the collection system can further include one or more optical elements (not shown in FIG. 3A), including objective lenses or curved mirrors, relay optical elements, directional filters, polarizers, and/or other elements. In some embodiments, the collection system can include catadioptric elements. Detector array 110 can deploy complementary metal-oxide-semiconductor (CMOS) image sensors, charge-coupled devices (CCDs), hybrid CMOS-CCD image sensors, photomultiplier tubes (e.g., an array of photocathode-based pixels), photodiodes, phototransistors, 2D imaging cameras, 1D line scanners, multi-cell segmented detectors, or any other suitable photon detectors.

In some embodiments, CMOS image sensors used in detector array 110 can be high-speed and low-noise sensors. For example, CMOS image sensors can have speed at or above 1 Gigapixel per second and noise at 10*e* or less, e.g., in the range of 2e-5e or even less, in some embodiments.

In some embodiments, the thickness metrology system 300 can perform thickness measurements for multiple locations on sample 102. In some embodiments, sample 102 can be supported by a movable stage 318 (e.g., robot blade) that can impart translational and/or rotational motion to sample 102 to reposition the illuminated—by the focused beam 104—spot relative to sample 102. In some embodiments, instead of (or in addition to) repositioning of sample 102, the incident beam 114 (and focused beam 104) can be repositioned. For example, an angle of propagation of incident beam 114 can be controlled by changing orientation of mirror 310-C and a parallel translation of incident beam 114 can be achieved by moving a support platform 320 of mirror 310-C, e.g., in the horizontal direction.

The thickness metrology system 300 can detect interference patterns formed by reflected beams 106 and 108, e.g., as disclosed above in conjunction with FIGS. 1-2, and can detect variations in sample 102 thickness h(X,Y) as moving stage 318 repositions sample 102 relative to focused beam 104. In some practical applications, knowledge of variations of thickness h(X,Y)—as opposed to the absolute thickness—is sufficient as various processing operations and/or uses of processed samples can have a higher tolerance to the overall (average) thickness than to thickness non-uniformity. Furthermore, the overall thickness can often be corrected via relatively straightforward additional processing (e.g., polishing). Nonetheless, in some instances, knowledge of the absolute thickness at various locations of the samples can also be useful. The thickness metrology system 300 enables determining such absolute thickness by analyzing a dependence of the interference patterns formed by reflected beams 106 and 108 on the angle of incidence that the focused beam 104 makes with sample 102.

More specifically, two consecutive angles of refraction $\theta_{1R}$ and $\theta_{2R}$, for which two adjacent bright (or dark) fringes are observed, result in the phase difference $\Delta\Phi_1=2\pi$. (In the description of FIG. 3A and FIG. 3C, the subscript R distinguishes angles of light propagation in sample 102 from angles of light propagation in vacuum or air, which do not have this subscript.) According to Eq. (1), knowledge of such angles $\theta 1$ and $\theta_2$ determines the local value of the sample thickness, $$h(X, Y) = \frac{\lambda}{2n(\cos\theta_{1R} - \cos\theta_{2R})}, \quad \text{Eq. (8)}$$

Identification of angles $\theta_{1R}$ and $\theta_{2R}$ can be performed by varying the angle of incidence of focused beam 104. In some embodiments, determination of the absolute thickness using Eq. (8) can be performed with a collimated beam, in some embodiments.

Figure 3B:
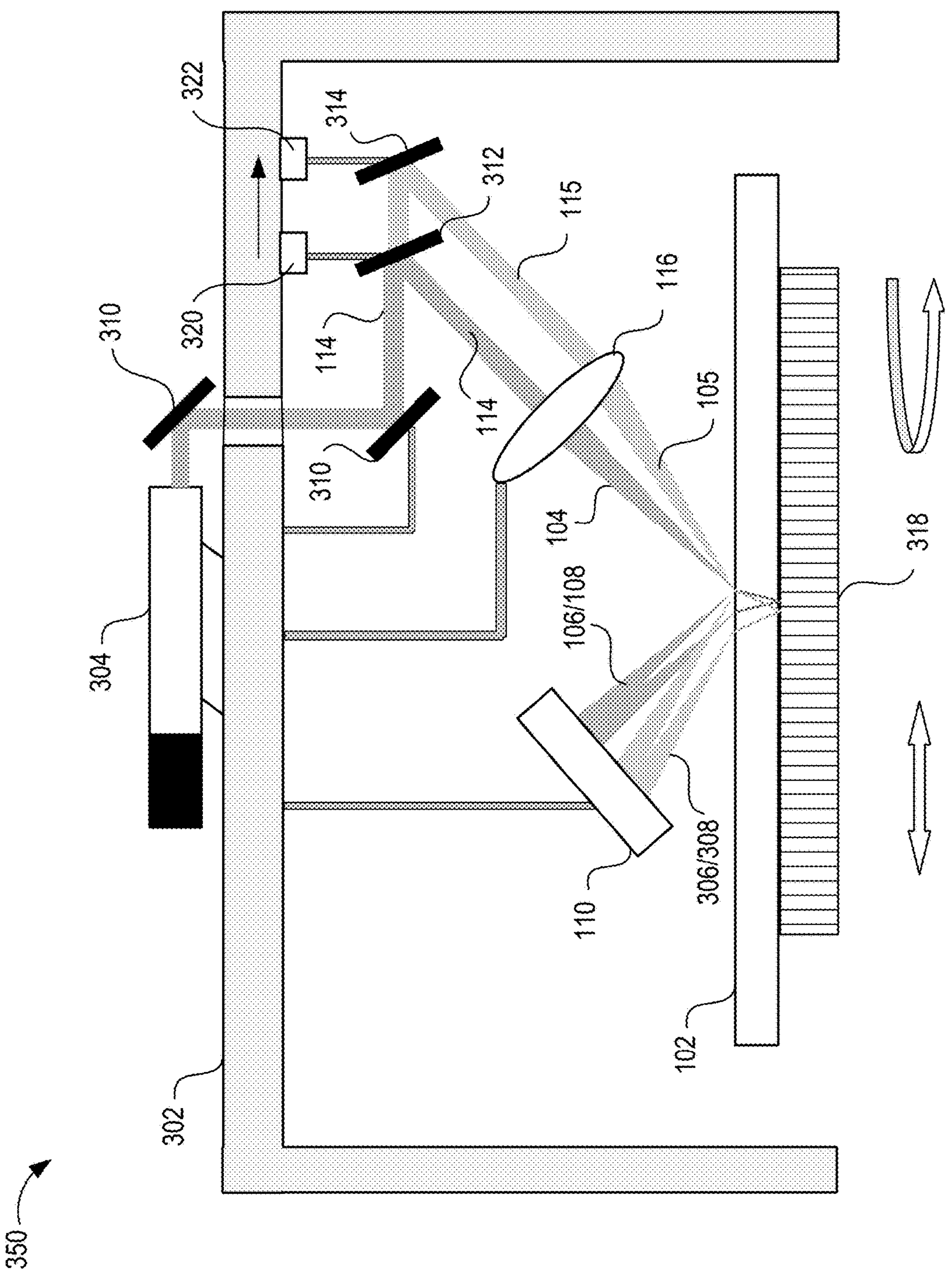
FIG. 3B illustrates another example of an interferometry-based thickness metrology system, in accordance with at least one embodiment.

FIG. 3B illustrates another example of an interferometry-based thickness metrology system 350, in accordance with at least one embodiment. Thickness metrology system 350 deploys an incident beam having an adjustable angle of incidence. More specifically, the illumination system can include one or more stationary mirrors 310 and one or more movable mirrors, e.g., mirror 312 connected to movable support platform 320. At a first position of mirror 312, incident beam 114 (and, correspondingly, focused beam 104) can propagate along the optical axis of focusing optics 116. Array of detectors 110 can be used to detect a first interference pattern formed by reflected beams 106 and 108. Support platform 320 can then be moved, e.g., horizontally, to a new position 314 of mirror 312 where the incident beam follows a different path (beam 115) and, after passing through focusing optics 116, forms a new focused beam 105. If the focal point of focusing optics 116 is located at (or near) sample 102, the new focused beam 105 illuminates the same spot of sample 102 as was illuminated by focused beam 114 but now has a different angle of incidence. Support platform 320 can be moved to a new position 314 where reflected beams 306 and 308 (generated upon reflection of new focused beam 105) create a second interference pattern that is maximally close to the first interference pattern, indicative of the phase difference $\Delta\Phi_1=2\pi$ between the two patterns. The angles of incidence of the two beams can then be used to determine thickness h of sample 102, e.g., as described below in conjunction with FIG. 3C.

Figure 3C:
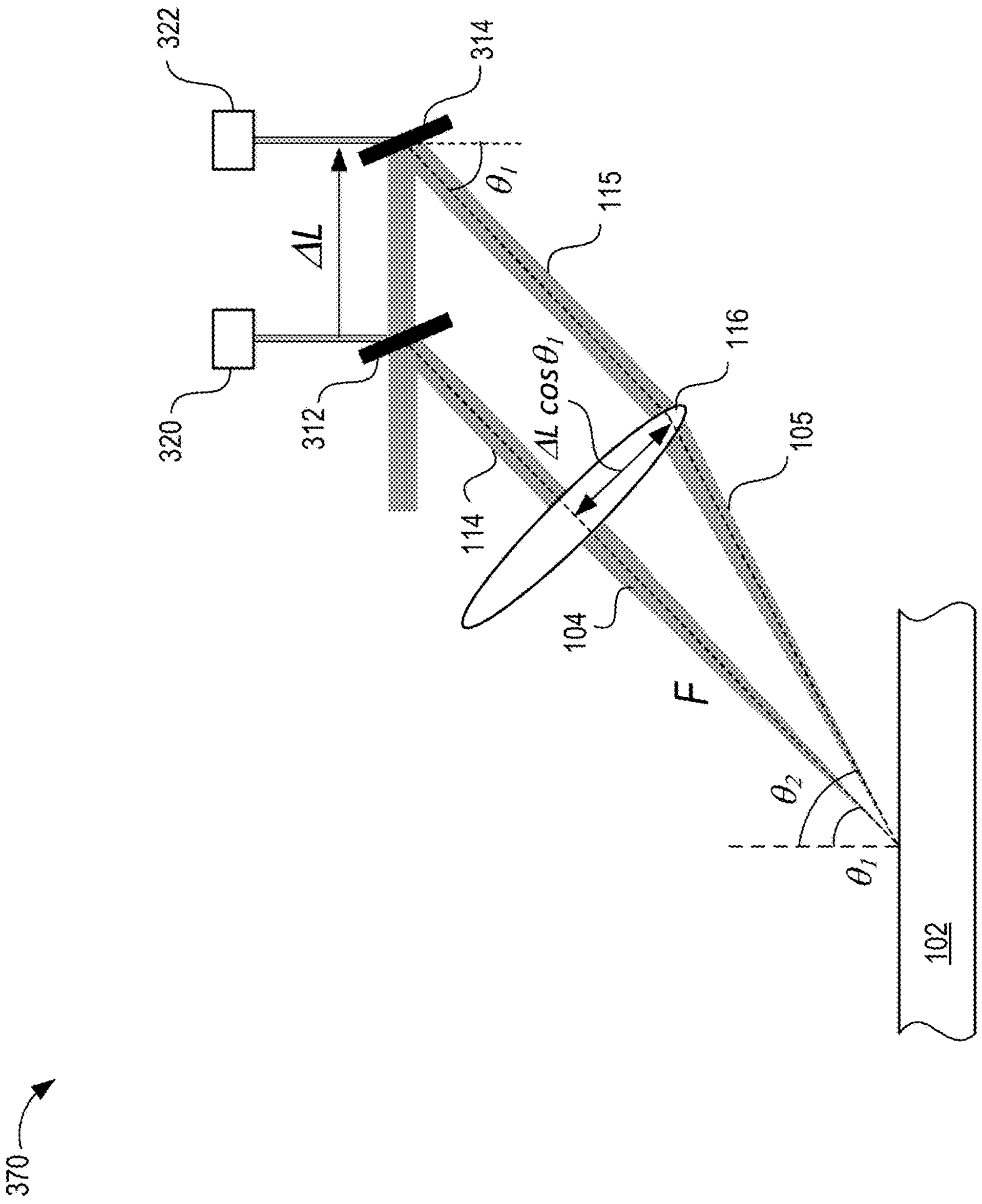
FIG. 3C illustrates an example thickness metrology setup that can be used with the thickness metrology system of FIG. 3B, in accordance with at least one embodiment.

FIG. 3C illustrates an example thickness metrology setup 370 that can be used with the thickness metrology system 350 of FIG. 3B, in accordance with at least one embodiment. The metrology setup 370 illustrates two positions of a mirror 312 directing a first incident beam 114 and a second incident beam 115 (at position 314) towards focusing optics 116. As illustrated, the first incident beam 114 and the second incident beam 115 are parallel to each other. For the sake of simplicity of illustration, an example non-limiting case of mirror 312 moving parallel to the plane of sample 102 is illustrated. Furthermore, for concreteness, incident beam 114 (and, correspondingly, focused beam 104) is shown as propagating along the optical axis of focusing optics 116, though this is not a limitation. After support platform 320 is displaced to a new position 322 over horizontal distance $\Delta L$, the incident beam follows a path (beam 115) that strikes focusing optics 116 at an offset $\Delta L \cos\theta_1$ from the optical axis. Provided that the focal distance of focusing optics 116 is F and the focal point is located at (or near) sample 102, the difference in the angles of incidence of focused beam 104 and focused beam 105 satisfies the condition is $\tan(\theta_2-\theta_1)=\Delta L\cos\theta_1/F$. Accordingly, the following equation (that makes use of Snell's law $\sin\theta_{2R}=\sin\theta_2/n$), $$h=\frac{\lambda}{2n}\left\{\cos\theta_{1R}-\left[1-n^{-2}\left[\sin\left(\theta_1+\arctan\frac{\Delta L\cos\theta_1}{F}\right)\right]^2\right]^{1/2}\right\}^{-1},\qquad \text{Eq. (9)}$$

expresses local height of the sample as a function of focal length F of focusing optics 116, wavelength of light $\lambda$, and the measured horizontal shift of the incident beam $\Delta L$ that causes an interference pattern (observed by detector array 110 in FIG. 3B) to be repeated. In Eq. (9), the angle of incident light propagation $\theta_1$ can be fixed as part of the geometry of the thickness metrology setup 370 and the (fixed) angle of refraction $\theta_{1R}$ can be precomputed based on Snell's law, $\sin\theta_{1R}=\sin\theta_1/n$.

In some embodiments, instead of measuring the angle difference $\theta_2-\theta_1$ corresponding to a $2\pi$-shift between two bright or two dark interference fringes (e.g., as disclosed above), a difference $\theta_2-\theta_1$ corresponding to a $\pi$-shift, e.g., a phase shift between a bright fringe or a dark fringe, can be measured and used for determining the absolute thickness h of the sample.

In some embodiments, instead of using the thickness metrology setup 370 of FIG. 3C, another technique of determining $\theta_{2R}$ that corresponds to a second bright or dark fringe can be used. For example, the angle of incidence $\theta_2$ can be identified based on the distance $\delta x$ between the two fringes observed within the imaging plane 112 of detector array 110 (see FIG. 1). The change in the angle of incidence $\theta_2-\theta_1$ can then be determined as $\theta_2-\theta_1=\delta x/z$, where z is the length of reflected beams 106 and 108 followed by use of Eq. (8) that determines the absolute height of the sample.

Figure 4:
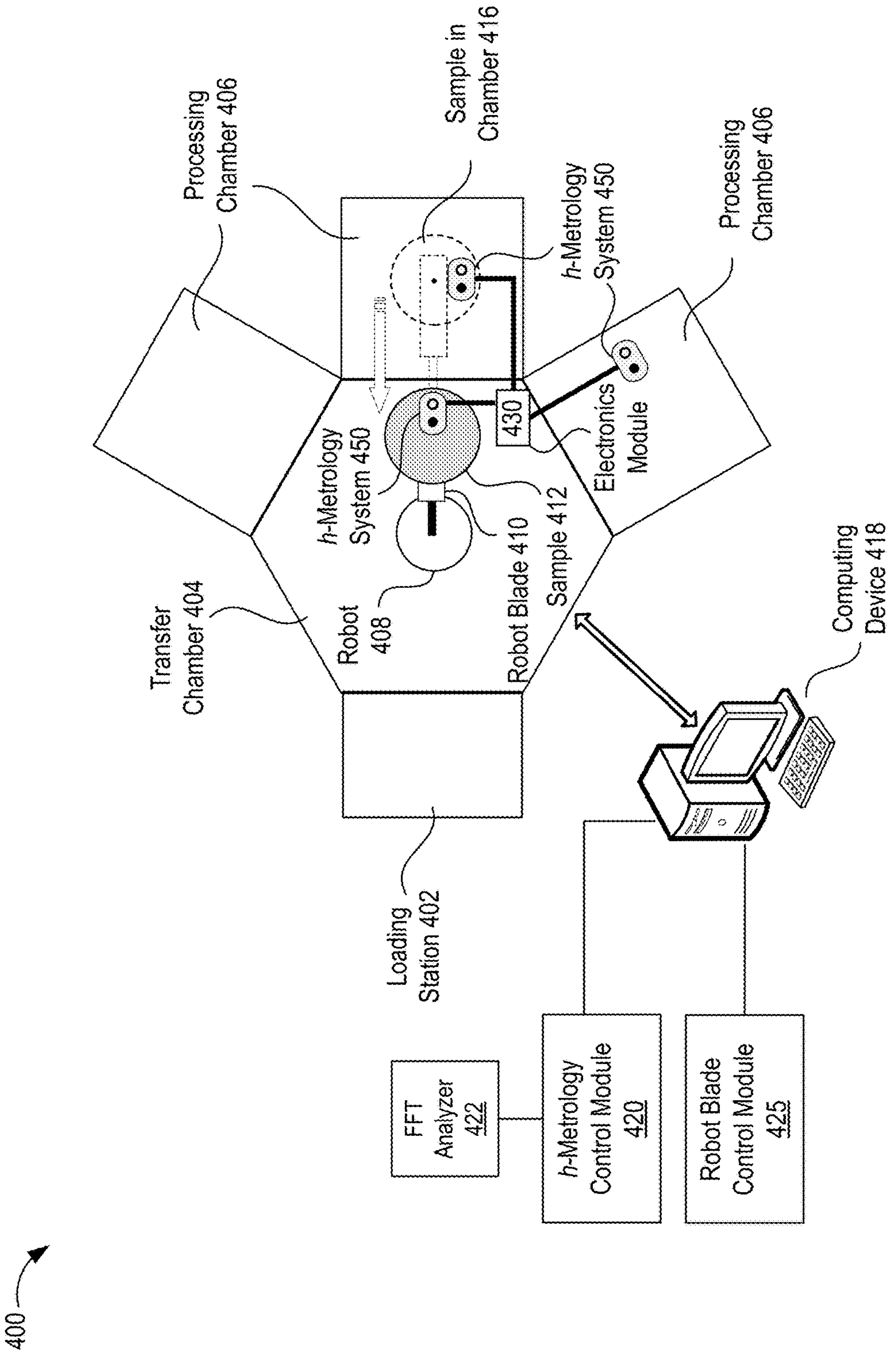
FIG. 4 illustrates one example manufacturing machine capable of deploying an interferometry-based thickness metrology system, according to one embodiment.

FIG. 4 illustrates one example manufacturing machine 400 capable of deploying an interferometry-based thickness metrology system, according to one embodiment. In one embodiment, manufacturing machine 400 includes a loading station 402 (e.g., load-lock chamber), a transfer chamber 404, and one or more processing chambers 406. Processing chamber(s) 406 can be interfaced to the transfer chamber 404 via transfer ports (not shown). The number of processing chamber(s) associated with the transfer chamber 404 need not be limited (with three processing chambers indicated in FIG. 4, as a way of example). Transfer chamber 404 can host a robot 408 operating a robot blade 410 that can support and move a sample 412 (e.g., a wafer, substrate, and/or the like) and/or other movable objects within the manufacturing machine 400. Transfer chamber 404 may be held under pressure (temperature) that is higher or lower than the atmospheric pressure (room temperature). Robot 408 can transfer sample 412 and/or various other products and devices between loading station 402, transfer chamber 404, and any of the processing chambers 406.

In one embodiment, robot blade 410 of robot 408 supports sample 416 when the latter is transferred into one of processing chambers 406. Robot blade 410 can be attached to an extendable arm of robot 408 having a length that is sufficient to reach to different chambers. Sample 412 (and/or sample 416) can be a semiconductor wafer, dielectric wafer, and/or any other object that is transparent (or partially transparent) and that can be placed or transported into one of processing chambers 406, loading station 402, transfer chamber 404, ports connecting transfer chamber 404 to loading station 402 or the processing chambers 406, and/or the like.

Robot blade 410 can deliver (and retrieve) samples to (and from) processing chamber(s) 406 through a slit valve port (not shown) while a lid to processing chamber(s) 406 remains closed. Processing chamber(s) 406 can contain processing gasses, plasma, and various particles used in deposition processes. In some embodiments, a magnetic field can exist inside processing chamber(s) 406. The inside of processing chamber(s) 406 can be held at temperatures and/or pressures that are different from the temperature and/or pressure outside processing chamber(s) 406. Although sample 412 is shown as being supported and moved by robot blade 410 of robot 408, in some embodiments, sample 412 can be transported using a dedicated motion stage or any other suitable movable stage, an existing substrate transfer mechanism, an existing motion mechanism in a process chamber (such as a polishing head or another wafer deployed in a CMP process).

Manufacturing machine 400 can deploy one or more thickness metrology (h-metrology) systems 450 operating as disclosed in conjunction with FIGS. 1-3 above. h-Metrology system 450 can include one or more measurement units, each unit having an illumination system, which conditions, directs, and focuses incident light onto a target surface, and a detection system that collects and detects light reflected from the target surface. Some individual measurement units can be located at fixed positions relative to transfer chamber 404, processing chamber(s) 406, and/or any other suitable portion of manufacturing machine 400. Some of the individual units of h-metrology system 450 can be located fully inside transfer chamber 404, processing chamber(s) 406, and/or the like. Some of the individual units of h-metrology system 450 can be located fully outside the respective chambers, e.g., directing incident light through a window into the respective chamber(s) and collecting reflected light through the same window or a different window. Some of the individual units of h-metrology system 450 can be located partially outside and partially inside the respective chamber (s), e.g., directing incident light through a window in the chamber's wall and collecting reflected light using a detector located inside the chamber(s), or vice versa (e.g., using a source of light located inside the chamber(s) but collecting reflected light through a window). In some embodiments, at least some of the individual units of h-metrology system 450 can be removably mounted on robot blade 410 that is capable of moving the respective unit(s) between various portions of manufacturing machine, e.g., between transfer chamber 404 and one or more of processing chambers 406, loading station 402, and/or the like.

A computing device 418 can set up and control execution of at least some processing operations of manufacturing system 400, such as opening loading station 402, receiving samples in loading station 402, moving the received samples from loading station 402 to transfer chamber 404, equalizing pressures/temperatures between transfer chamber 404 and loading station 402 and/or processing chamber(s) 406, transferring the samples into and/or from processing chamber(s) 406, selecting and carrying out processing operations on the samples in processing chamber(s) 406, transferring processing samples back to loading station 402, and/or performing any other suitable operations. Computing device 418 can include an h-metrology control module 420 that controls operations of h-metrology system and a robot blade control module 425 that controls operations of robot blade 410. In one embodiment, h-metrology control module 420 can receive interference patterns detected by individual units of h-metrology control module 420 and determine thickness of pertinent samples.

In some embodiments, h-metrology control module 420 can deploy a Fast Fourier Transform (FFT) analyzer 422 that processes pixelated intensity I(x,y) of the reflected light and identifies position-dependent portion $I_{INT}(x,y)$ of this intensity representative of an interference pattern described in conjunction with FIG. 1. Coordinates x and y can be pixel coordinates associated with detector array 110 (in FIG. 1). In some embodiments, FFT analyzer 422 can use pixels (x,y) as individual FFT points with the number of FFT points coinciding with the number of pixels in detector array 110. In other embodiments, the number of FFT points can be greater than the number of pixels. For example, intensity I(x,y) can undergo an upsampling that introduces one or more additional intensity values between each pair of adjacent pixels, e.g., using various interpolation techniques, such as spline interpolation. When thickness of a sample changes, FFT analyzer 422 can identify a shift $\Delta x$ between an interference pattern in $I_{INT}(x, y; t_1)$ associated with a current time relative to spatially shifted earlier interference pattern $I_{INT}(x, y; t_2)$ associated with time $t_2<t_1$, e.g., by identifying a spatial translation $I_{INT}(x+\Delta x, y; t_2)$ that results in a maximum overlap of the two interference patterns.

In some embodiments, operations of h-metrology system 450 can be supported by an electronics module 430. Electronics module 430 can include a microcontroller and a memory buffer coupled to the microcontroller. In some embodiments, electronics module 430 can perform at least some processing of the light reflections data, including but not limited to performing FFT computations and identifying profiles of the sample(s). The memory buffer can be used to collect and store data, e.g., a partially or fully processed light reflection data. In some embodiments, the data can be transmitted using a wireless communication circuit. In other embodiments, the data can be transmitted using a wired connection between electronics module 430 and computing device 418. In some embodiments, the data can first be stored (buffered) in the memory buffer prior to being transmitted to computing device 418. In other embodiments, the data can be streamed to computing device 418 as the data is being collected, without being stored in the memory buffer. In some embodiments, the wireless or wired connection can be continuous. In other embodiments, the wireless or wired connection can be established periodically or upon completion of the inspection or some other triggering event, e.g., when a certain minimum degree of sample non-uniformity is detected. Electronics module 430 can further include a power element and a power-up circuit. In some embodiments, the power element can be (or include) a battery. In some embodiments, the power element can be a capacitor. The power element can be rechargeable from a power station. The microcontroller can be coupled to one or more units of h-metrology system 450. In some embodiments, electronics module 430 can also control at least some operations of robot 408. In some embodiments, electronics module 430 can include an accelerometer to facilitate accurate extension and angular rotation of the robot blade 410 and/or rotation of samples 412 and 416 around samples' axes.

Electronics module 430 can further include a wireless communication circuit, e.g., a radio circuitry for receiving wireless instructions from the computing device 418 and for transmitting light reflection data to computing device 418. For example, the radio circuitry can include an RF front end module and an antenna (e.g., a UHF antenna), which can be an internal ceramic antenna, in one embodiment. The batteries may be of a high temperature-tolerant type such as lithium-ion batteries that can be exposed to a chamber temperature of 450 degrees Celsius for a short time period such as one to eight minutes.

The wireless connection facilitated by the RF front end and antenna can support a communication link between the microcontroller and computing device 418, in some embodiments. In some embodiments, the microcontroller integrated with the robot 408 can have a minimal computational functionality sufficient to communicate information to the computing device 418, where most of the processing of information can occur. In other embodiments, the microcontroller can carry out a significant portion of computations, while the computing device 418 can provide computational support for specific, processing-intensive tasks. Data received by the computing device 418 can include data obtained from the inside of the transfer chamber 404, the processing chambers 406, data collected by h-metrology system 450, data temporarily or permanently stored in the memory buffer, and so on. The data stored in the memory buffer and/or transmitted to or from the computing device 418 may be in a raw or processed format.

Some components of electronics module 430 can be located on or at the stationary part of the robot 408. For example, the microcontroller, the memory buffer, and the RF front end may be so located. Other components of electronics module 430 can be located on or at the robot blade 410 of the robot 408 and/or individual units of h-metrology system 450.

Figure 5:
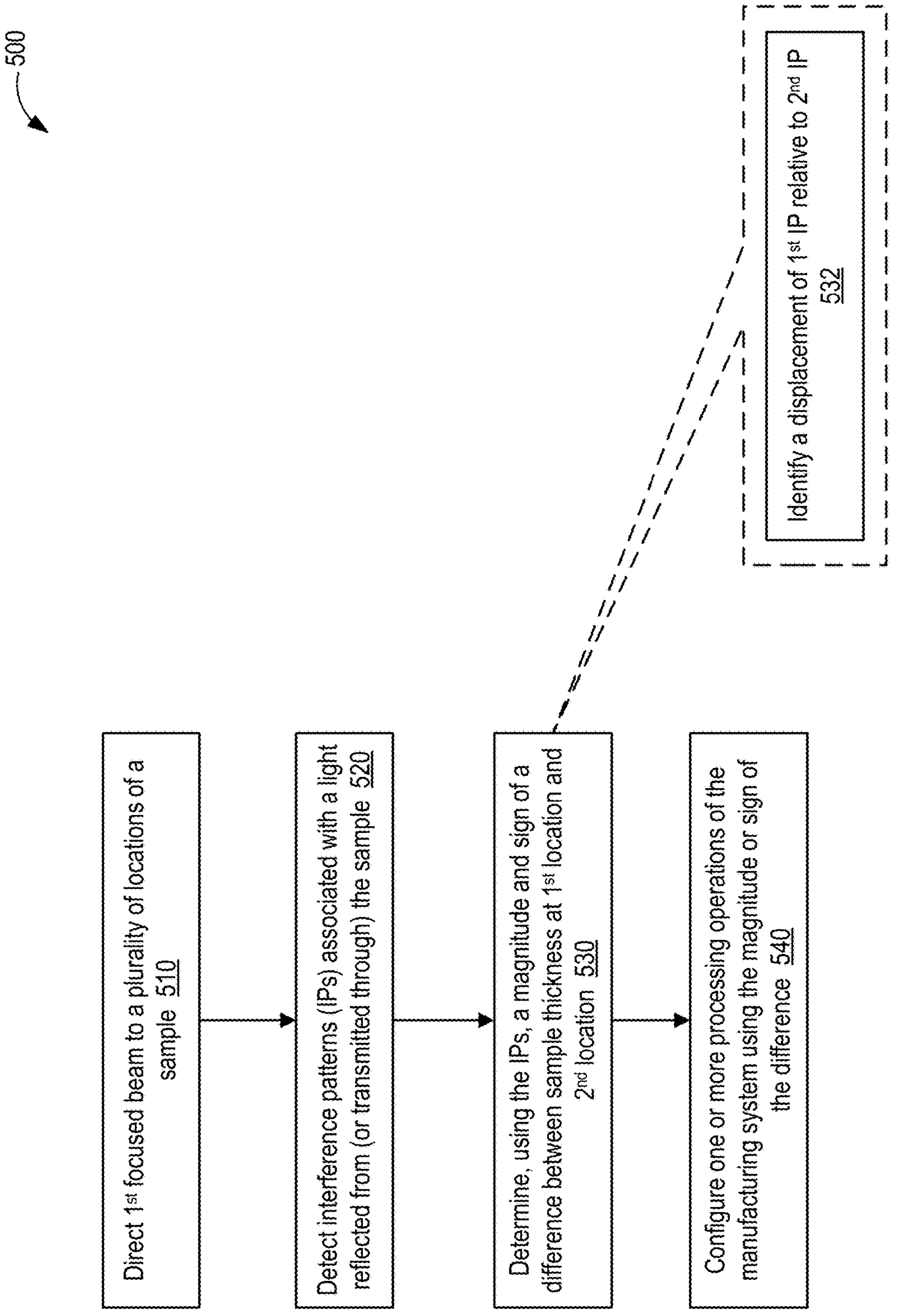
FIG. 5 is a flow diagram of an example method of interferometry-based thickness metrology of samples in manufacturing systems, in accordance with some embodiments of the present disclosure.

FIG. 5 is a flow diagram of an example method 500 of interferometry-based thickness metrology of samples in manufacturing systems, in accordance with some embodiments of the present disclosure. In some embodiments, method 500 is performed by systems and components of a semiconductor manufacturing system. In some embodiments, method 500 is performed using systems and components disclosed in conjunction with FIGS. 1-4 or a combination thereof, e.g., thickness metrology system 300 of FIG. 3A or thickness metrology system 350 of FIG. 3C, or any suitable combination of such systems and components. Performance of method 500 can be supported by various computing devices, e.g., computing device 418 and/or electronic module 430 of FIG. 4. In some embodiments, the computing devices supporting method 500 can deploy one or more central processing units (CPUs), microprocessors, digital signal processors (DSP), application-specific integrated circuits (ASIC), finite-state machines, field-programmable gate arrays (FPGA), and so on, which can be coupled to one or more memory devices (e.g., a random-access memory, a read-only memory, a flash memory, a static memory, and so on). In some embodiments, the processing devices execute software or firmware instructions of method 500 stored in the memory device(s) and/or on any suitable non-transitory computer-readable media. In some embodiments, some of the blocks of method 500 are optional.

At block 510, performed for a plurality of locations of a sample (e.g., sample 102), method 500 can include directing a first focused beam to a respective location of the plurality of locations of the sample (e.g., focused beam 104 in FIG. 1), e.g., a first location, a second location, and so on. In some embodiments, the first focused beam can include one or more monochromatic components, e.g., monochromatic light generated by a laser source. In some embodiments, the focused beam can have a Gaussian profile. In some embodiments, the sample includes a wafer. In some embodiments, the sample can further include one or more films deposited on the wafer.

At block 520, method 500 can continue with detecting, for each of the plurality of locations of the sample, an interference pattern (IP) associated with a light departing from the respective location, e.g., a first (second, etc.) IP associated with a first (second, etc.) light departing from the first location. The light departing from the sample can be generated upon interaction of the first focused beam with the sample. In some embodiments, the first light departing from the first location can include a first reflected beam caused by reflection of the first focused beam from a first surface of the sample at the first location (e.g., reflected beam 106 in FIG. 1) and can further include a second reflected beam caused by reflection of the first focused beam from a second surface of the sample at the first location (e.g., reflected beam 108 in FIG. 1).

Similarly, the second light departing from the second location can include a third reflected beam caused by reflection of the first focused beam from the first surface of the sample at the second location, and a fourth reflected beam caused by reflection of the first focused beam from the second surface of the sample at the second location.

In some embodiments, the first light departing from the first location can include a first transmitted beam caused by refraction of the first focused beam at the first location (e.g., first transmitted beam 120), and can further include a second transmitted beam caused by combined refraction-reflection of the first focused beam at the first location (e.g., second transmitted beam 122). In such embodiments, the first (second) IP can be, at least partially, caused by curved wavefronts of the first transmitted beam and the second transmitted beam.

The plurality of detected IPs can include a first IP associated with a first light departing from a first location (e.g., $X_1$, $Y_1$) of the plurality of locations. The plurality of detected IPs can further include a second IP associated with a second light departing from a second location (e.g., $X_2$, $Y_2$) of the plurality of locations (e.g., as illustrated in FIG. 2). In some embodiments, the first (second, etc.) IP can be detected by a plurality of spaced elements (e.g., individual pixels) of a light detector, each of the plurality of spaced elements detecting a respective portion of the first (second, etc.) IP. For example, the first IP can be detected by measuring an intensity of a superposition of the first reflected beam and the second reflected beam, e.g., intensity I(x,y), where x and y are some coordinates associated with an array of detectors and identifying a position-dependent portion $I_{INT}$(x,y) of the intensity I(x,y), e.g., by processing the intensity I(x,y) using a Fast Fourier Transform analyzer. The first (second) IP can be, at least partially, caused by curved wavefronts of the first reflected beam and the second reflected beam (third reflected beam and the fourth reflected beam).

At block 530, method 500 can continue with determining, based on the first IP and the second IP, a magnitude and a sign of a difference h(X,Y)−h(X',Y') between a first thickness of the sample at the first location and a second thickness of the sample at the second location. In some embodiments, as illustrated in the callout block 532, determining the magnitude and the sign of the difference h(X,Y)−h(X',Y') can include identifying a displacement (along one or more spatial axes of a detector array, e.g., x-axis) of the second IP relative to the first IP (e.g., as illustrated in FIG. 2 and further described in conjunction with FIG. 1).

At block 540, method 500 may continue with configuring, responsive to the determined magnitude and sign of the difference h(X,Y)−h(X',Y'), one or more processing operations of the manufacturing system. For example, configuring the processing operation(s) can include performing some remedial processing of the sample, e.g., performing additional polishing of the sample, etching and/or deposition. In some instances, adjustments can be applied to subsequent samples processed by the manufacturing system. For example, such adjustments can include modifying chemical composition, pressure, temperature, etc., of an environment of some portion of the manufacturing system, such as a processing chamber, a transfer chamber, a loading chamber, and/or the like.

Figure 6:
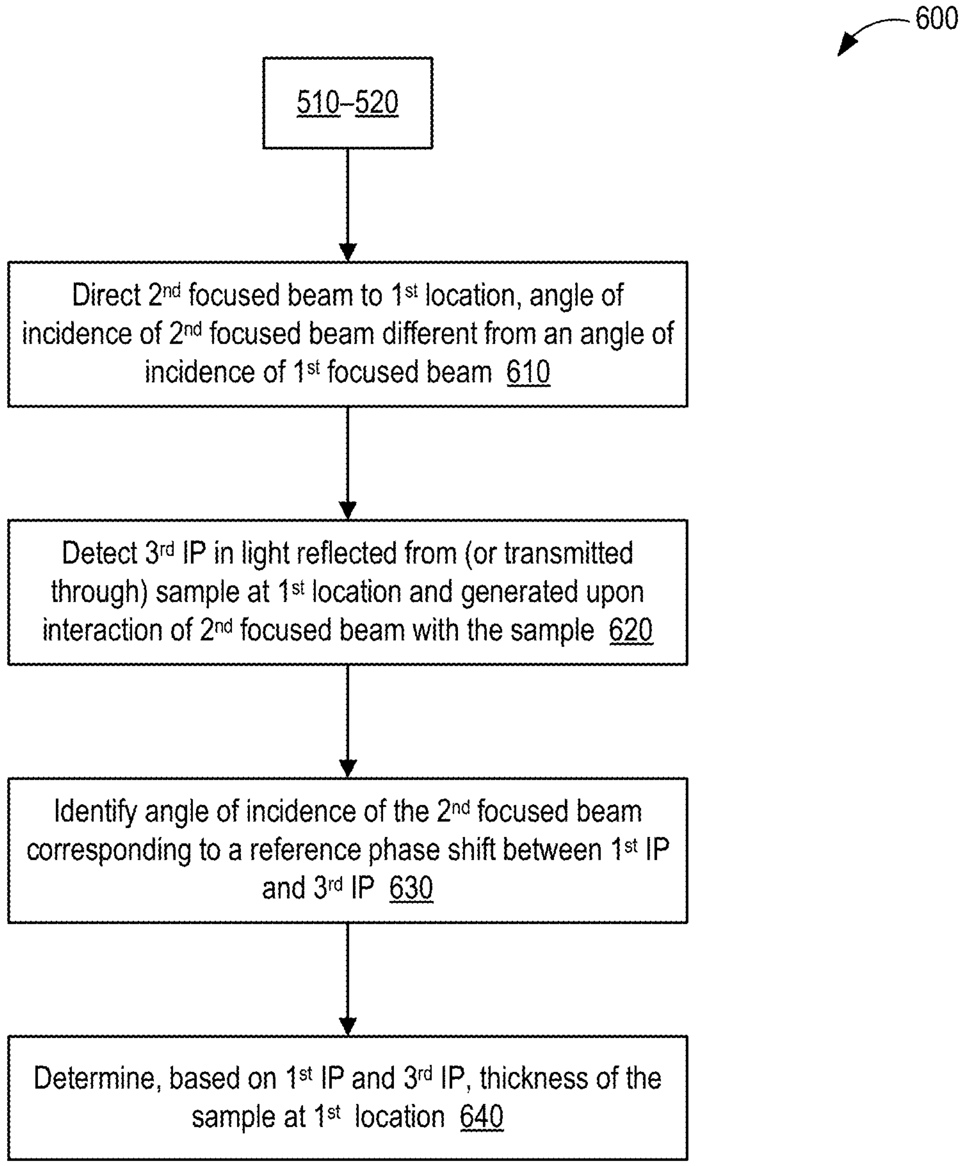
FIG. 6 is a flow diagram of an example method of measuring absolute thickness of samples in manufacturing systems using interferometry-based thickness metrology, in accordance with some embodiments of the present disclosure.

FIG. 6 is a flow diagram of an example method 600 of measuring absolute thickness of samples in manufacturing systems using interferometry-based thickness metrology, in accordance with some embodiments of the present disclosure. In some embodiments, method 600 can include one or more operations of method 500, e.g., blocks 510 and 520. At block 610, method 600 can include directing a second focused beam (e.g., focused beam 105 in FIG. 3B and FIG. 3C) to the first location. An angle of incidence of the second focused beam (e.g., $\theta_2$) can be different from an angle of incidence of the first focused beam (e.g., $\theta_1$). At block 620, method 600 can continue with detecting a third IP associated with a third light departing from the second location and generated upon interaction of the second focused beam with the sample. For example, the third light can include reflected beams 306 and 308, as illustrated in FIG. 3B). At block 640, method 600 can include determining, based on the first IP and the third IP, a thickness of the sample at the first location. In some embodiments, determining the thickness of the sample at the first location can be performed as disclosed in conjunction with FIG. 3C. For example, as illustrated with block 630, determining the thickness of the sample at the first location can include identifying the angle of incidence of the second focused beam (e.g., $\theta_2$) corresponding to a reference phase shift between the first IP and the third IP. In particular, the reference phase shift may be a $2\pi$-shift, e.g., a phase shift between two bright or two dark interference fringes. In some embodiments, the reference phase shift may be a $\pi$-shift, e.g., a phase shift between a bright interference fringe and a dark interference fringe.

It should be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The embodiments of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment, embodiment, and/or other exemplary language does not necessarily refer to the same embodiment or the same example, but may refer to different and distinct embodiments, as well as potentially the same embodiment.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. Also, the terms "first, " "second," "third," "fourth," etc. as used herein are meant as labels to distinguish among different elements and may not necessarily have an ordinal meaning according to their numerical designation.

What is claimed is:

1. A method comprising:

directing a first focused beam to a first location of a sample;

detecting a first interference pattern (IP) associated with a first light departing from the first location and generated upon interaction of the first focused beam with the sample;

directing the first focused beam to a second location of the sample;

detecting a second IP associated with a second light departing from the second location and generated upon interaction of the first focused beam with the sample, wherein the first IP and the second IP are spatially resolved along an axis within a detection plane; and determining, based at least on the first IP and the second IP:

a magnitude of a difference between a first thickness of the sample at the first location and a second thickness of the sample at the second location, and a sign of the difference between the first thickness of the sample at the first location and the second thickness of the sample at the second location based at least on a shift of the second IP relative to the first IP along the axis within the detection plane.

2. The method of claim 1, wherein the first focused beam has a Gaussian profile.

3. The method of claim 1, wherein the first light departing from the first location comprises:

a first reflected beam caused by reflection of the first focused beam from a first surface of the sample at the first location, and a second reflected beam caused by reflection of the first focused beam from a second surface of the sample at the first location; and wherein the first IP is at least partially caused by curved wavefronts of the first reflected beam and the second reflected beam.

4. The method of claim 3, wherein the second light departing from the second location comprises:

a third reflected beam caused by reflection of the first focused beam from the first surface of the sample at the second location, and a fourth reflected beam caused by reflection of the first focused beam from the second surface of the sample at the second location; and wherein the second IP is at least partially caused by curved wavefronts of the third reflected beam and the fourth reflected beam.

5. The method of claim 4, wherein determining the magnitude and the sign of the difference between the first thickness and the second thickness comprises:

identifying a displacement of the second IP relative to the first IP.

6. The method of claim 1, further comprising:

directing a second focused beam to the first location, wherein an angle of incidence of the second focused beam is different from an angle of incidence of the first focused beam;

detecting a third IP associated with a third light departing from the first location and generated upon interaction of the second focused beam with the sample; and determining, based on the first IP and the third IP, a thickness of the sample at the first location.

7. The method of claim 6, wherein determining the thickness of the sample at the first location comprises:

identifying the angle of incidence of the second focused beam corresponding to a reference phase shift between the first IP and the third IP.

8. The method of claim 7, wherein the reference phase shift comprises at least one of a 2 $\pi$-shift or a w-shift.

9. The method of claim 1, wherein the sample comprises a wafer.

10. The method of claim 9, wherein the sample further comprises one or more films deposited on the wafer.

11. The method of claim 1, wherein the first IP is detected by a plurality of spaced elements of a light detector, each of the plurality of spaced elements detecting a respective portion of the first IP.

12. The method of claim 1, wherein the first light departing from the first location comprises:

a first transmitted beam caused by refraction of the first focused beam at the first location, and a second transmitted beam caused by combined refraction-reflection of the first focused beam at the first location; and wherein the first IP is at least partially caused by curved wavefronts of the first transmitted beam and the second transmitted beam.

13. The method of claim 1, further comprising:

configuring, responsive to the at least one of the magnitude of the difference or the sign of the difference, one or more processing operations on at least one of the sample or an additional sample.

14. A system comprising:

an illumination system to:

generate a first focused beam;

direct the first focused beam to a first location of a sample; and direct the first focused beam to a second location of the sample;

a detection system to:

detect a first interference pattern (IP) associated with a first light departing from the first location and generated upon interaction of the first focused beam with the sample; and detect a second IP associated with a second light departing from the second location and generated upon interaction of the first focused beam with the sample, wherein the first IP and the second IP are spatially resolved along an axis within a detection plane; and a processing device to:

determine, based at least on the first IP and the second IP:

a magnitude of a difference between a first thickness of the sample at the first location and a second thickness of the sample at the second location, and a sign of the difference between the first thickness of the sample at the first location and the second thickness of the sample at the second location based at least on a shift of the second IP relative to the first IP along the axis within the detection plane.

15. The system of claim 14, wherein the first light departing from the first location comprises:

a first reflected beam caused by reflection of the first focused beam from a first surface of the sample at the first location, and a second reflected beam caused by reflection of the first focused beam from a second surface of the sample at the first location; and wherein the first IP is at least partially caused by curved wavefronts of the first reflected beam and the second reflected beam.

16. The system of claim 15, wherein the second light departing from the second location comprises:

a third reflected beam caused by reflection of the first focused beam from the first surface of the sample at the second location, and a fourth reflected beam caused by reflection of the first focused beam from the second surface of the sample at the second location; and wherein the second IP is at least partially caused by curved wavefronts of the third reflected beam and the fourth reflected beam.

17. The system of claim 16, wherein to determine the magnitude and the sign of the difference between the first thickness and the second thickness, the processing device is to:

identify a displacement of the second IP relative to the first IP.

18. The system of claim 14, wherein the illumination system is further to:

direct a second focused beam to the first location, wherein an angle of incidence of the second focused beam is different from an angle of incidence of the first focused beam;

wherein the detection system is further to:

detect a third IP associated with a third light departing from the first location and generated upon interaction of the second focused beam with the sample; and wherein the processing device is further to:

determine, based on the first IP and the third IP, a thickness of the sample at the first location.

19. The system of claim 14, wherein the detection system comprises a plurality of spaced elements, each of the plurality of spaced elements detecting a respective portion of the first IP.

20. A semiconductor manufacturing system comprising:

one or more processing chambers to process a sample; and a sample thickness metrology system comprising:
an illumination system to:
generate a first focused beam;
direct the first focused beam to a first location of a sample; and
direct the first focused beam to a second location of the sample; and
a detection system to:
detect a first interference pattern (IP) associated with a first light departing from the first location and generated upon interaction of the first focused beam with the sample; and
detect a second IP associated with a second light departing from the second location and generated upon interaction of the first focused beam with the sample, wherein the first IP and the second IP are spatially resolved along an axis within a detection plane; and
a processing device to:
determine, based at least on the first IP and the second IP:
a magnitude of a difference between a first thickness of the sample at the first location and a second thickness of the sample at the second location, and
a sign of the difference between the first thickness of the sample at the first location and the second thickness of the sample at the second location based at least on a shift of the second IP relative to the first IP along the axis within the detection plane.

* * * * *